Figure 1:
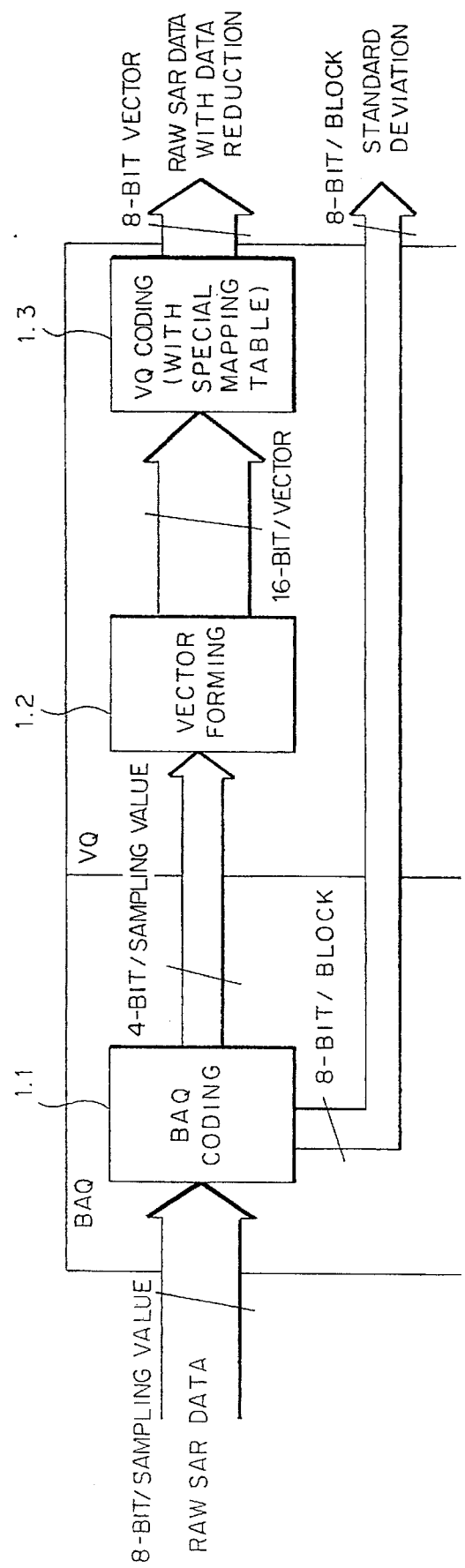

United States Patent [19]

Moreira et al.

[11] Patent Number: 5,661,477
[45] Date of Patent: Aug. 26, 1997

[54] METHODS FOR COMPRESSING AND DECOMPRESSING RAW DIGITAL SAR DATA AND DEVICES FOR EXECUTING THEM

[75] Inventors: Alberto Moreira, Garching; Frank Bläser, Taufkirchen, both of Germany

[73] Assignee: Deutsche Forschungsanstalt fur Luft- und Raumfaht e.V., Köln, Germany

[21] Appl. No.: 510,699

[22] Filed: Aug. 3, 1995

[30] Foreign Application Priority Data

Aug. 5, 1994 [DE] Germany ............ 44 27 656.7

[51] Int. Cl.⁶ .................................... H03M 7/00
[52] U.S. Cl. ............................................. 341/50
[58] Field of Search .................. 341/50, 51, 106, 341/95; 342/25, 58, 194, 195

[56] References Cited

U.S. PATENT DOCUMENTS 4,801,939 1/1989 Jones .......................... 342/25

OTHER PUBLICATIONS

Murat Kunt, "Second-Generation Image-Coding Techniques", Proceeding of the IEEE, vol. 73, No. 4, Apr. 1985 pp. 549,551.

H.G. Georg, "Advances in Picture Coding", Proceedings of the IEEE, vol. 73, No. 4, Apr. 1985, pp. 523,539.

John C. Curlander, "Synthetic Aperture Radar Systems and Signal Processing", A Wiley–Interscience, pp. 282–295, Jul. 1992.

Yoseph Linde, "An Algorithm for Vector Quantizer Design", IEEE Transaction on Communications, vol. Com–28, No. 1, Jan. 1980.

Ronald Kwok, "Block Adaptive Quantization of Magellan SAR Data", IEEE Transactions on Geoscience and Remote Sensing, vol. 27, No. 4, Jul. 1989.

Robert Gray, "Vector Quantization", IEEE ASSP Magazine, Apr. 1984.

Joel Max, "Quantizing for Minimum Distortion", pp. 6–13, Mar. 1960.

Macdonald Dettwiler, "Data Encoding Techniques Study", vol. 1: SAR Study, Apr. 1992.

Primary Examiner—Brian K. Young
Attorney, Agent, or Firm—Browdy and Neimark

[57] ABSTRACT

In a method for compressing raw digital SAR data input data are first coded with fewer bits by means of an adaptive block quantization (BAQ) and subsequently vectors are formed from the block-quantized data. The vectors are coded by a special mapping table in order to achieve an effective data reduction. In a method for decompressing digital data, vectors are generated from the coded data by means of a code book table, from which scalar values are formed. After de-standardization of the scalar values, decoded data are obtained in that the scalar values are multiplied for the de-standardization by the standard deviation of each block already calculated during coding.

4 Claims, 4 Drawing Sheets

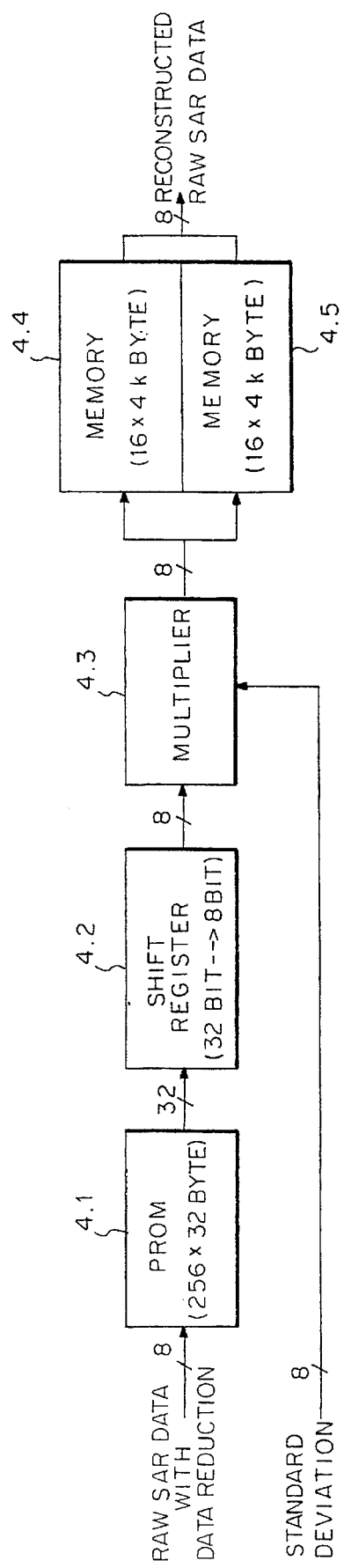

METHODS FOR COMPRESSING AND DECOMPRESSING RAW DIGITAL SAR DATA AND DEVICES FOR EXECUTING THEM

The invention relates to methods for compressing and decompressing raw digital SAR data. Thus, raw digital SAR (synthetic aperture radar) data are compressed for transmission or storage and are then de- or uncompressed for further processing. In this case "compression" is defined as a reduction of the amount of data by means of coding or a reduction of the amount of bits per sampling value.

Radar systems are used for mapping the surface of planets or objects. In respect to optical systems such radar systems have the advantage of being independent of the time of day and the respective meteorological conditions. Also, a very high degree of geometric resolution is obtained with synthetic aperture radar (SAR).

An SAR system has a platform, such as an airplane, a helicopter, a satellite, or the like, which moves at a speed as constant as possible, as well as a coherent radar system periodically emitting electromagnetic pulses (pulsed operation). The direction of movement of the platform is identified as azimuth direction and the direction extending orthogonally to it, i.e. transversely to the direction of flight, as range direction.

During straight ahead flight a strip of terrain is mapped whose width corresponds to the illumination width of the antenna in the range direction and whose length in the azimuth direction corresponds to the distance traveled. Reflected radar echoes are received, shifted in frequency, i.e. mixed, quadrature-modulated and digitized.

The digital raw SAR data are obtained at this time, which consists of an in-phase and a quadrature-phase channel because of the quadrature modulation. An SAR image is generated from the raw SAR data by means of digital processing. In this case digital processing is very expensive and at this time can only be produced in real time (on line) with considerable hardware outlay. For this reason the raw data are mostly stored on data media or are directly transmitted to a ground station. The raw data are processed into SAR images only on the ground, off-line, so to speak.

The high data rates which are generated when raw SAR data are recorded pose a problem in connection with all SAR systems. Since in most cases image processing of the raw SAR data in real time is not possible, the data must be intermediately stored. With aircraft-borne SAR systems the data are stored on magnetic tapes. With satellite-borne systems the data are directly transmitted to a ground station and further processed there.

With present-day satellite systems the data rates generated here are approximately 100 Mbits/s. With future, multichannel SAR systems the data rate will increase considerably. A satellite can no longer transmit at these data rates, mainly because of the limited amount of energy available to the satellite. For this reason it is necessary to compress the data prior to transmission. The compressed data are formatted and transmitted to a ground station. There the data are again deformatted and must be un- or decompressed in order to be digitally processed.

On-board data compression has the advantage that the data rates for transmission to a ground station are considerably reduced. Because of the compression it is also possible to store more data intermediately in a satellite. This allows extended recordation in orbital sections in which a direct transmission to a ground station is not possible. As a whole, the amount of data to be stored is reduced corresponding to the compression.

Because of the high entropy of the data, a lossless compression does not produce the desired compression factors. For this reason lossy compression methods are used, because of which deviations between the original data and the reconstructed data occur after decompression.

Up to now a block adaptive quantizer (BAQ) was used in satellites for medium-based compression of the raw data. For example, a BAQ system was integrated into the Magellan probe, whose sole scientific device is a radar installation. (Kwok, R., Johnson, W. T. K. in "Block Adaptive Quantization of Magellan SAR Data", IEEE Trans on Geosc. and Remote Sensing, vol. 27, July 1989, No. 4, pp. 375 to 383). This type of data reduction will also be employed in the ASAR satellite systems.

A great advantage resides in the extremely simple hardware implementation (Curlander, J. C., McDonough, R. N. in "Synthetic Aperture Radar Systems and Signal Processing", Hohn Wiley & Sons, Inc., New York, 1991, pp. 289 to 294). The statistical properties of the raw data are essential for BAQ. The raw data, which consist of an in-phase channel and a quadrature-phase channel represent a complex, Gauss-distributed signal having a mean value of zero.

However, the entire raw data have a very large dynamic range which is well covered by digitizing the data by five to eight bits per sample value and channel. If now a small area (block) of the data file is removed, for example (16×16) sampling values, the same statistical properties apply to it as for the entire raw data. Therefore the data in a block are also Gauss-distributed and have a mean value of zero. However, the dynamic range within a block is considerably less than that of the entire raw data.

Because of the reduced dynamics, a block can be satisfactorily quantized with fewer bits, for example with two bits. For this purpose the standard deviation of the block is determined. The optimal Max quantizer (Max. J. in "Quantization for Minimum Distortion", IEEE Trans. IRE, vol. 6, 1960, p. 712) is adapted by means of the standard deviation of the block to the dynamic range of the block. Thus the entire raw data are divided into small blocks and each block is quantized by means of a quantizer optimally adapted to the block. Because of the adaptation of the quantizer, a characteristic quantization curve is created which is almost constant for the entire dynamic range of the raw data.

A vector quantizer (VQ) has gained increasing importance in the past years in the field of image processing, language processing and SAR image processing (Gray, R. M. in "Vector Quantization", IEEE ASSP Magazine, April 1984, pp. 4 to 29). This technique has been used only rarely for the reduction of raw SAR data (MacDonald Dettwiler in "Data Encoding Techniques Study—SAR Study", final report from ESTEC Contract No. 9122/90/NL/PR(SC), Jan. 1992).

Even though it is one of the most effective reduction methods, the large outlay regarding the implementation and coding mainly stands in the way of this system. In vector quantization, several respective sampling values are combined into vectors. Then the entire vector is quantized in that it is mapped on a small number of possible input vectors which are then stored in a so-called code book.

Coding takes place by calculating the signal-to-noise ratio of the input vector in relation to all code book vectors. The code book vector in respect to which the input vector has the lowest signal-to-noise ratio is binary coded and therefore is a compressed signal. The code book must be adapted to the respective raw data set, which in most cases is performed by means of the LBG (Linde-Buzo-Gray)

algorithm (see Linde, Y., Buzo A., Gray, R. M. "An Algorithm for Vector Quantizer Design", IEEE Trans. on Communications, vol. COM-28, No. 1, Jan. 1980). A training sequence of vectors is generated for this.

The multi-dimensional vector space-is divided into several space segments and space centers, which are the vectors of the code book, are determined from the training vectors which are located in the individual segments. In connection with a Gauss-distributed signal without a correlation between the sampling values, a signl/digitizing signal-to-noise ratio which is higher by up to 3.5 dB in comparison to BAQ is obtained.

The above described BAQ method has the disadvantage that it results in only a mediocre signal/digitizing signal-to-noise ratio (SDNR). An SDNR ratio of 8.7 dB is achieved for a 2-bit quantization per sampling value and per channel; for a 1-bit quantization 2.4 dB are therefore obtained.

In contrast thereto, the computational outlay for the code book and for coding is so great with vector quantization (VQ), that up to now no hardware realization for real time processing suitable for satellites has been possible.

It is therefore the object of the invention to provide a method for compressing and decompressing raw digital SAR data as well as devices for executing it, wherein an image quality approximately corresponding to that of a vector quantization can be achieved with a computational outlay which approximately corresponds to that of the BAQ method.

In accordance with the invention this is attained in connection with methods for compression and decompression of raw digital SAR data by means of the features in the characterizing parts of claim 1 or claim 2. Devices for executing the methods for compression and decompression of raw digital SAR data are subject of claims 3 or 4.

In accordance with the invention, a novel BAVQ algorithm (Block Adaptive Vector Quantizer) has been created by a synthesis of the BAQ method and vector quantization (VQ), wherein the computational outlay for coding is only slightly higher than with the BAQ method, while the image quality of the methods in accordance with the invention almost corresponds to that of vector quantization (VQ).

With the methods in accordance with the invention, first the input data are coded with the BAQ, because of which the data are standardized to a standard deviation of one. Subsequently vectors are formed from the standardized data and an optimal code book is calculated which, because of the standardization, is applicable to all raw data frameworks and for whose calculation medium-supported hardware is required.

There is only a limited number of possible input vectors because of the previously performed BAQ coding. Thus coding by means of the vector quantizer can be performed with a direct mapping of an input vector on an output vector. For this purpose an output vector is directly assigned to each possible input vector by means of a table. Because of this the extensive calculation of the distortion between an input vector and the vectors of the code book can be omitted.

The number of bits per sampling value after coding with the BAQ as well as the VQ is variable, depending on what demands are made on the compression rate, the signal to distortion ratio, the system properties and the hardware outlay. Hardware suitable for space can be realized by means of so-called ASICs (Application-Specific Integrated Circuit). A satisfactory amplitude calibration of approximately 1 dB is obtained with a reduction to two bits per sampling value and channel.

Figure 2:
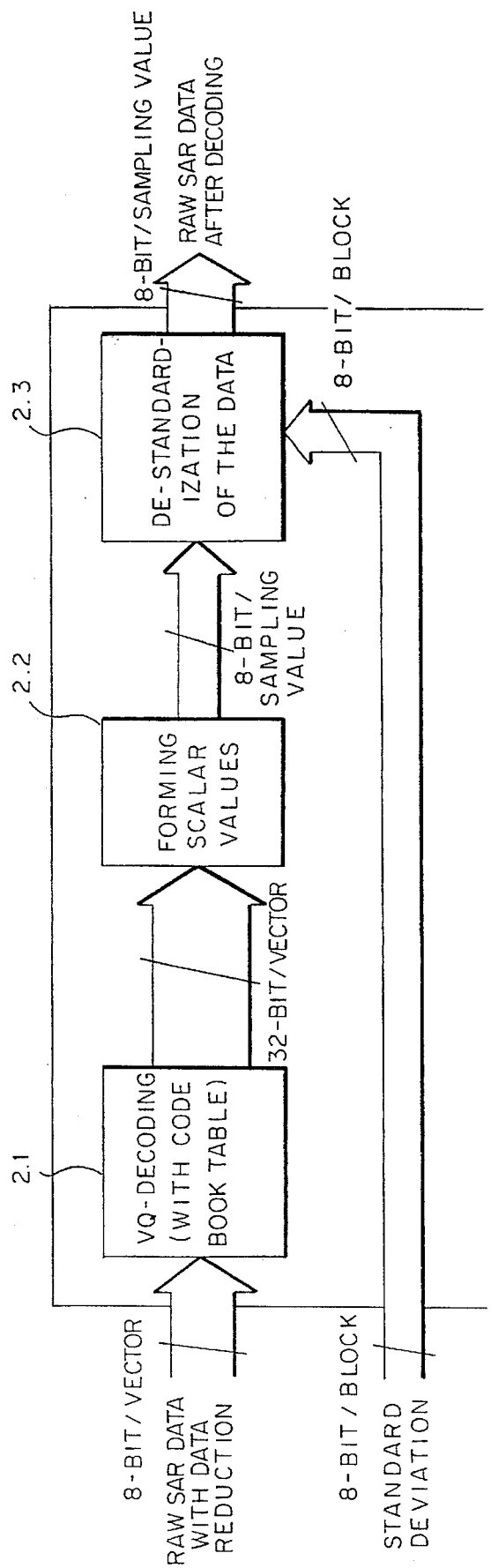
Figure 3:
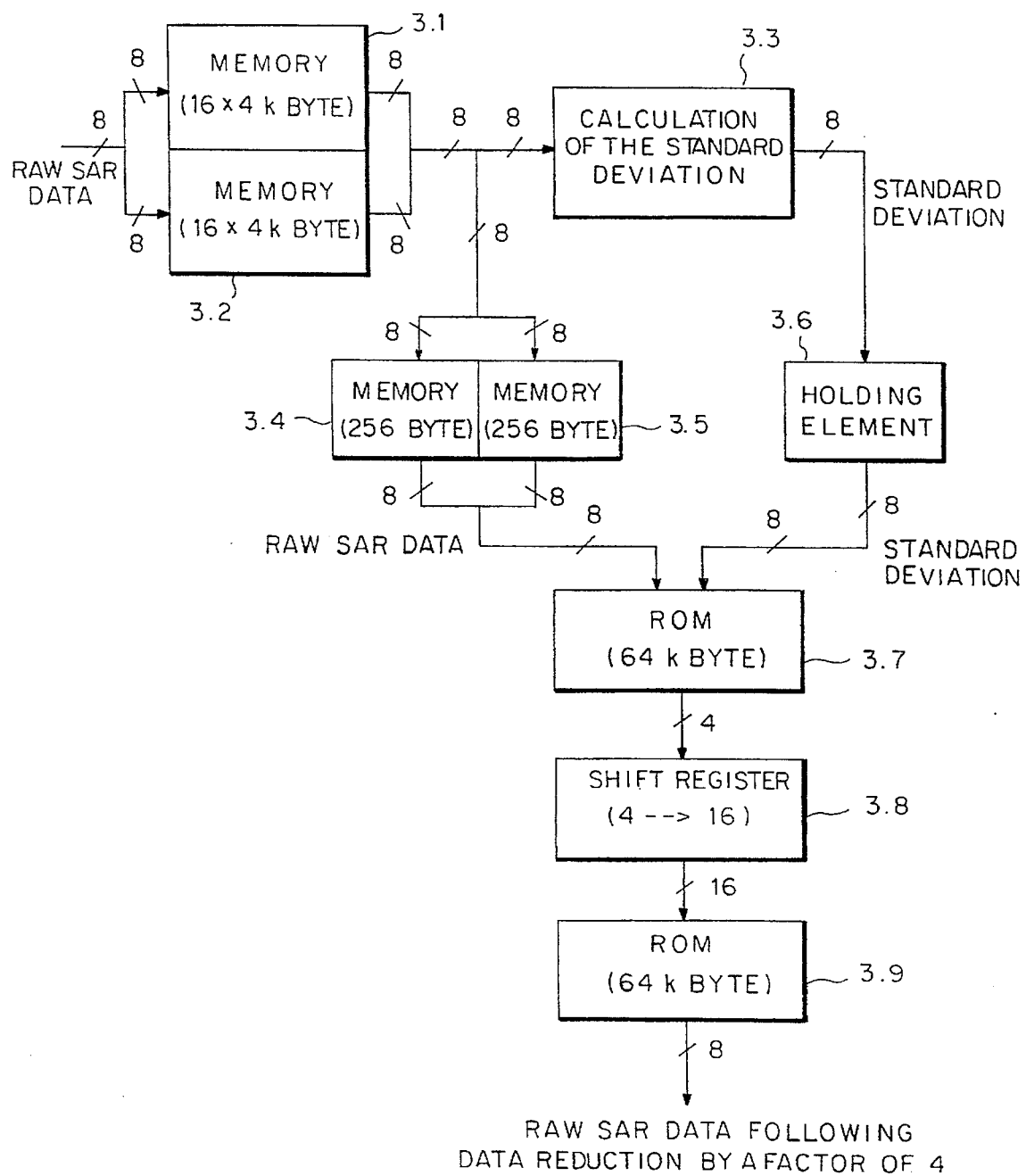

The invention will be explained in detail below by means of preferred exemplary embodiments, making reference to the attached drawings. Shown are in:

FIG. 1, a flow diagram of an exemplary embodiment of the method in accordance with the invention with a coding of SAR data corresponding to a block adaptive vector quantizer (BAVQ);

FIG. 2, a flow diagram of an exemplary embodiment of the method in accordance with the invention with a decoding of raw SAR data corresponding to the BAVQ;

FIG. 3, a detailed block diagram of an exemplary embodiment wherein raw SAR data are coded in accordance with the BAVQ, and FIG. 4, a detailed block diagram of an exemplary embodiment wherein raw SAR data are decoded in accordance with the BAVQ.

The exemplary embodiment in FIG. 1 represents a flow diagram for coding a channel of the complex input signal. Since the compression pattern for the two channels is identical, only one channel, namely the in-phase or the quadrature channel, will be described in what follows. A differentiation between two different tables is made in connection with the algorithm. In this case a special mapping table (see Block 1.3 in FIG. 1) is required when coding the raw data. Decoding then takes place with the aid of a so-called code book table (see Block 2.1 in FIG. 2).

In the embodiment in FIG. 1, digitized raw data are first compressed to four bits per sampling value in a BAVQ coder. In the process, the data are combined into blocks with (16×16) sampling values and a standard deviation is determined (Block 1.1 in FIG. 1). By means of the standard deviation an optimal Max quantizer is adapted to the dynamics of the block and the individual sampling values are coded. This standard deviation determined in this way will only be needed again during decoding. Following decoding with the aid of the BAQ method, the data have the same statistical properties independently of the respective block and consist of discrete values; in FIG. 1 they consist of four bits per sampling value, as indicated to the right of the block 1.1 in FIG. 1.

For a vector coding which now follows, the individual sampling values in the azimuth and/or range direction are combined in a vector forming unit 1.2 into a vector; in the embodiment of FIG. 1 four sampling values are combined in a vector. Because of the BAVQ compression, a limited number of input vectors is possible; in FIG. 1 there are $2^{16}$, i.e. 64 k possibilities.

Vector coding takes place with the aid of a special mapping table (Block 1.3), whose size is identical to the number of possible input vectors. The input vector is interpreted as an address or pointer to a table element. In FIG. 1 a 16-bit address is the result. In this case each one of the possible input vectors points to a different table element. The content of the table elements in turn consists of the addresses of the associated vectors of the code book, which, however, in accordance with the desired compression factors have considerably fewer bits; in FIG. 1 they are eight-bit addresses.

These output addresses represent the coded signal and are transmitted or stored together with the standard deviation. The created bit rate per sampling value in FIG. 1 is two bits per sampling value, to which is added a bit rate of 0.031 bits per sampling value for the eight-bit standard deviation which must be transmitted for each block.

In a BAVQ decoding in FIG. 2, decoding is no longer separately performed in accordance with BAQ and vector quantization (VQ). In a BAVQ decoder 2 the compressed signal, i.e. the address, points to respectively one of the output vectors which are combined in a code book table (Block 2.1). Their output vectors again have the same quantization as the input data in FIG. 1, but are still standardized. Scalar values are now again formed from code book vectors (Block 2.2), these are then de-standardized by means of the appropriate standard deviation by being multiplied by the standard deviation in a de-standardization unit 2.3. The decompressed sampling values therefore again have the quantization of the original data, which in FIG. 8 is eight bits per sampling value.

The generation of the code book takes place similar to that of the pure vector quantizer; however, a prepared training sequence is required. A characteristic portion of the raw data is selected for this and is coded with the BAQ in accordance with the BAVQ coding. The coded data are decoded with the optimal mapping values of the Max quantizer, but are not again adapted by means of the standard deviation to the original dynamics. In this way a standardized data field with the standard deviation one is obtained.

Now the vectors for the training sequence are formed from this data field. The generation of the code book for a training sequence can take place by means of the customary methods such as are proposed in the LGB algorithm. It is necessary to determine the code book vector with the lowest signal-to-noise ratio for each possible input vector in order to generate the special mapping table. The address of the code book vector in the code book is entered into the corresponding table element of the mapping table (Block 1.3 in FIG. 1).

An exemplary embodiment of a hardware implementation of the coding in accordance with the BAVQ algorithm will now be described by means of FIG. 3. Raw SAR data, which are quantized with eight bits, have several thousand radar echoes. The radar echoes are written into memories 3.1 and 3.2 and afterwards read out in blocks. In this case it has been assumed that each radar echo consists of 4096 sampling values and that the block size is (16×16) sampling values.

The memories 3.1 and 3.2 operate like a dual buffer, i.e. while 16 radar echoes are written into the memory 3.1, the data are read out in blocks from the memory 3.2. Following this operation the function of the two memories is reversed, so that the reading and the writing process is not interrupted.

The standard deviation from each block (16×16 sampling values) is determined by unit 3.3 for calculating the standard deviation and is taken over by means of a holding element (latch) 3.6. It is still present as a constant value at the output of the holding element 3.6 during the determination of the standard deviation of the next block.

The memories 3.4 and 3.5 also operate in the manner of a dual buffer; however, they cause a time delay of one block read-out process. While the values of one block are written into the memory 3.4, the data of the previous block are read out of the memory 3.5. The memory size is 256 bytes for a block size of (16×16) values in the azimuth and range direction. Following the reading and writing operation the function of the two memories 3.4 and 3.5 is reversed. The time delay by means of the dual operation of the memories 3.4 and 3.5 is necessary, since the calculation of the standard deviation of a block by the unit 3.3 for calculating the standard deviation also corresponds to a time delay of altogether one block read-out operation.

The raw SAR data and the associated standard deviation are present at an input of a ROM memory 3.7 with respectively eight bits. The ROM memory 3.7 with a capacity of 64 k bytes has the function of a table and reduces the quantization of the raw SAR data to four bits. The addresses of the ROM memory 3.7 consist of the raw SAR data and the standard deviation of respectively eight bits. The optimal characteristic curves of the four-bit quantizer for each value of the standard deviation are stored in the ROM memory 3.7, so that the output data of the ROM memory 3.7 represent the result of the quantization with four bits.

Four sampling values are combined into a vector by means of a shift register 3.8. Finally, the vectors are coded by a further ROM memory 3.9, which also has 64 k addresses, which corresponds to a vector quantization. A data reduction by a factor of four has been achieved in the exemplary embodiment.

An exemplary embodiment of a hardware implementation of a decoding in accordance with the BAVQ algorithm is represented in FIG. 4. Raw SAR data in coded form are present at the input of a ROM memory 4.1; the raw SAR data are decoded by the ROM memory 4.1, which has 256 memory cells with respectively 4 bytes, i.e. a total of 1 kbyte. Vectors consisting of four sampling values with respectively eight bits are present at the output of the ROM memory 4.1. Scalar sampling values are created by a shift register 4.2, which are de-standardized in a multiplication unit 4.3 following a multiplication with the standard deviation and therefore have the same dynamic range as the original raw SAR data.

Memories 4.4 and 4.5 of respectively 64 k bytes operate in the manner of a dual buffer. While the decompressed data are written in blocks into one memory the data are read by lines, i.e. one radar echo after the other, out of the other memory. This leads to the data at the output of the two memories 4.4 and 4.5 having the same sequence as the received radar echoes. The coded raw SAR data are available in a reconstructed form for SAR processing.

The above described basic concept of the invention can not only be employed with SAR data, but also with other data. A prerequisite is that the standard deviation within a data block can be assumed to be constant. The data need not necessary have a Gauss distribution, because the optimum working point of the BAQ quantizer and the optimum code book table of the VQ quantizer can also be calculated for a defined distribution. However, it is required that only the standard deviation and the mean value of the distribution change from one block to the next. The form of the distribution must remain the same in the entire data set.

For example, the method in accordance with the invention can be used in connection with SONAR (Sound Navigation And Ranging), space rain radar and with other types of systems which also employ a modulation frequency.

We claim:

1. A method for the compression and decompression of raw digital SAR data, a standard deviation and mean value of which is assumed to be constant within a predefined data block, comprising:

first coding input data with fewer bits by means of an adaptive block quantization (BAQ), wherein the standard deviation is determined and transmitted for coding and subsequent decoding;

forming vectors from the block-quantized data by means of a shift register, and secondly coding the formed vectors by means of a special mapping table (1.3) in order to achieve thereby an effective data reduction;

generating vectors from the coded data by means of a code book table (2.1);

forming scalar values from the vectors by means of the shift register, and obtaining the decoded data following a de-standardization of the scalar values (Block 2.3), including multiplying the scalar values with the already calculated standard deviation of each block for de-standardization in a multiplication unit (4.3).

2. A device for compressing and decompressing raw digital SAR data, comprising:

a first dual buffer of two memories (3.1; 3.2), including means for writing therein input data and reading out therefrom in blocks;

a following unit (3.3) for calculating the standard deviation, including means by which the standard deviation of each block is determined and transferred to a holding element (3.6);

a second dual buffer of two memories (3.4; 3.5) which is connected with the output of the first dual buffer (3.1; 3.2) and including means by which the data read out in blocks are delayed in time;

a ROM memory (3.7), including means by which the quantization of the data delayed in time are reduced to fewer bits;

a first shift register (3.8) following the ROM memory (3.7), including means by which vectors are formed from the individual sampling values of a block, and a further ROM memory (3.9) for the final coding of the formed vectors;

a ROM memory (4.1), including means by which vectors are generated from the coded data;

a second shift register (4.2) following the ROM memory (4.1), including means by which the scalar values are formed from the vectors;

a following multiplication unit (4.3) including means by which the data of each block are multiplied by a corresponding standard deviation; and a dual buffer of two memories (4.4, 4.5) including means by which the de-standardized data are written in by blocks and afterwards read out by lines, so that one radar echo after the other with the corresponding coded sampling values is output for further image processing.

3. The device according to claim 2, wherein the number of fewer bits is four bits.

4. A device for compressing and decompressing raw digital SAR data, a standard deviation and mean value of which is assumed to be constant within a predefined data block, comprising:

means for first coding input data with fewer bits by an adaptive block quantization (BAQ), wherein the standard deviation is determined and transmitted for coding and subsequent decoding;

means for forming vectors from the block-quantized data;

means for secondly coding the formed vectors by means of a special mapping table (1.3) in order to achieve thereby an effective data reduction;

means for generating vectors from the coded data by means of a code book table (2.1);

means for forming scalar values from the vectors;

means for obtaining the decoded data following a de-standardization of the scalar values (Block 2.3); and means for multiplying the scalar values with the already calculated standard deviation of each block for de-standardization.

* * * * *